(12) United States Patent
Chen

(10) Patent No.: US 6,503,785 B2
(45) Date of Patent: Jan. 7, 2003

(54) FLASH MEMORY CELL WITH CONTACTLESS BIT LINE, AND PROCESS OF FABRICATION

(75) Inventor: Chiou-Feng Chen, Cupertino, CA (US)

(73) Assignee: Actrans System Inc., Santa Clara, CA (US)

(*) Notice: Subject to any disclaimer, the term of this patent is extended or adjusted under 35 U.S.C. 154(b) by 0 days.

(21) Appl. No.: 09/862,078

(22) Filed: May 21, 2001

(65) Prior Publication Data

US 2002/0008277 A1 Jan. 24, 2002

Related U.S. Application Data

(62) Division of application No. 09/576,394, filed on May 22, 2000.

(51) Int. Cl.⁷ .......................................... H01L 21/8238
(52) U.S. Cl. ...................... 438/211; 257/314; 257/315; 257/316; 257/319; 257/320; 438/265; 438/267; 438/596
(58) Field of Search ................................. 438/265, 267, 438/596; 257/314, 315, 316, 319, 320

(56) References Cited

U.S. PATENT DOCUMENTS

| 4,698,787 | A | 10/1987 | Mukherjee et al. |
| 4,794,565 | A | 12/1988 | Wu et al. |
| 5,029,130 | A | 7/1991 | Yeh |
| 5,095,344 | A | 3/1992 | Harari |
| 5,208,174 | A | 5/1993 | Mori |
| 5,280,446 | A | 1/1994 | Ma et al. |
| 5,284,784 | A | 2/1994 | Manley |
| 5,286,994 | A | 2/1994 | Ozawa et al. |
| 5,364,806 | A | 11/1994 | Ma et al. |
| 5,402,371 | A | 3/1995 | Ono |
| 5,455,792 | A | 10/1995 | Yi |
| 5,495,441 | A | 2/1996 | Hong |
| 5,500,384 | A | 3/1996 | Melzner |
| 5,557,122 | A | 9/1996 | Shrivastava et al. |
| 5,615,147 | A | 3/1997 | Chang et al. |
| 5,643,812 | A | 7/1997 | Park |
| 5,726,471 | A | 3/1998 | Keller et al. |
| 5,767,005 | A | 6/1998 | Doan et al. |
| 5,770,501 | A | 6/1998 | Hong |
| 5,780,892 | A | 7/1998 | Chen |
| 5,792,670 | A | 8/1998 | Pio et al. |
| 5,838,039 | A | 11/1998 | Sato et al. |
| 5,847,427 | A | 12/1998 | Hagiwara |
| 5,847,996 | A | 12/1998 | Guterman et al. |
| 5,883,409 | A | 3/1999 | Guterman et al. |
| 5,917,214 | A | 6/1999 | Sung |
| 6,011,288 | A | 1/2000 | Lin et al. |
| 6,034,894 | A | 3/2000 | Maruyama et al. |
| 6,091,104 | A | 7/2000 | Chen |
| 6,104,057 | A | * 8/2000 | Nakanishi et al. ........... 257/314 |
| 6,291,297 | B1 | * 9/2001 | Chen ........................... 438/265 |

* cited by examiner

Primary Examiner—David Nelms
Assistant Examiner—Mai-Huong Tran
(74) Attorney, Agent, or Firm—Edward S. Wright

(57) ABSTRACT

Memory cell array and process of fabrication in which a floating gate is formed on a substrate for each of a plurality of memory cells, a control gate is formed above and in vertical alignment with each of the floating gates, source regions are formed in the substrate between and partially overlapped by first edge portions of the floating gates in adjacent ones of the cells, bit lines are formed in the substrate midway between second edge portions of the floating gates in adjacent ones of the cells, and a select gate is formed across the control gates, the floating gates, the bit lines and the source regions.

17 Claims, 10 Drawing Sheets

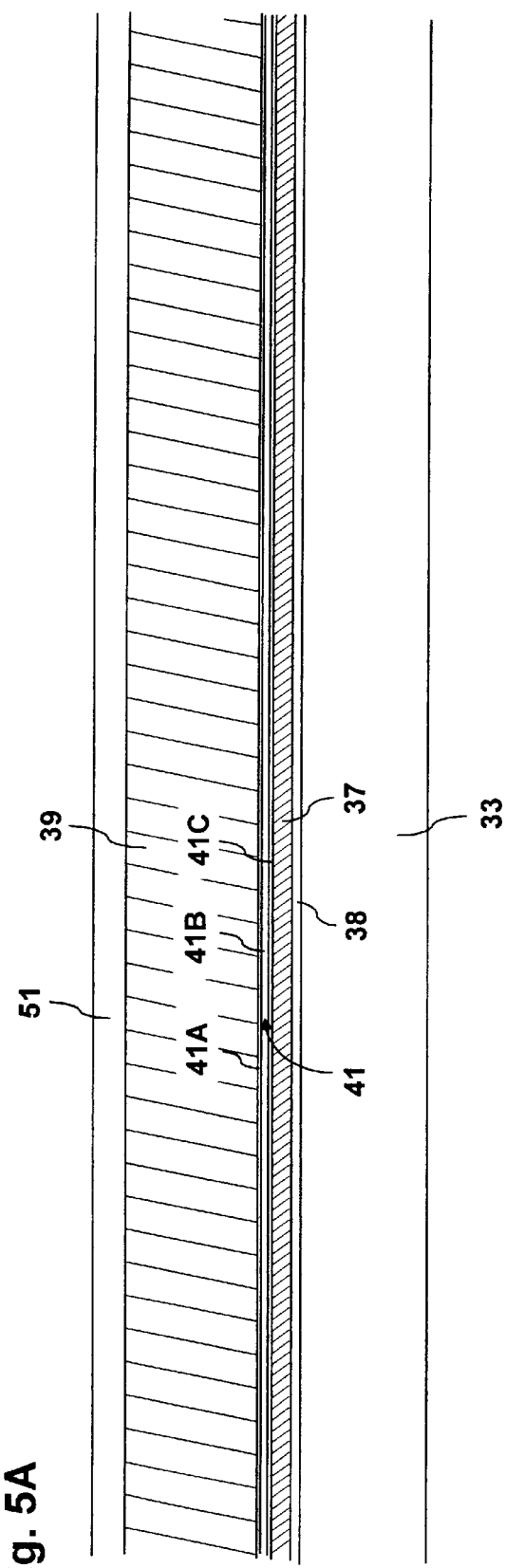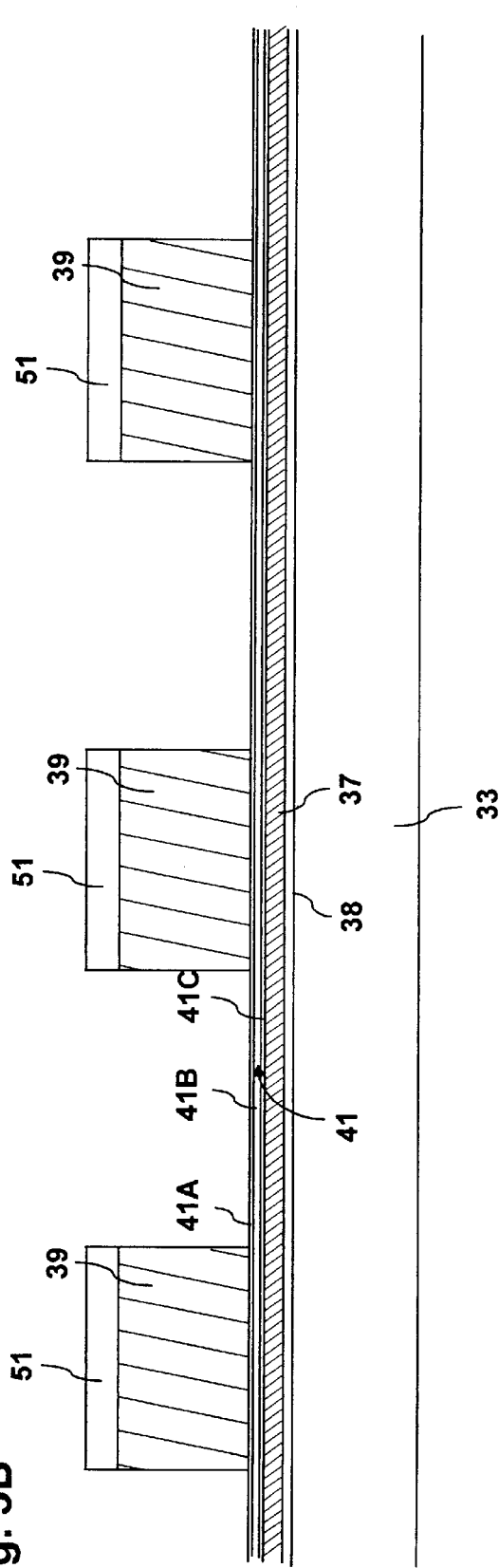

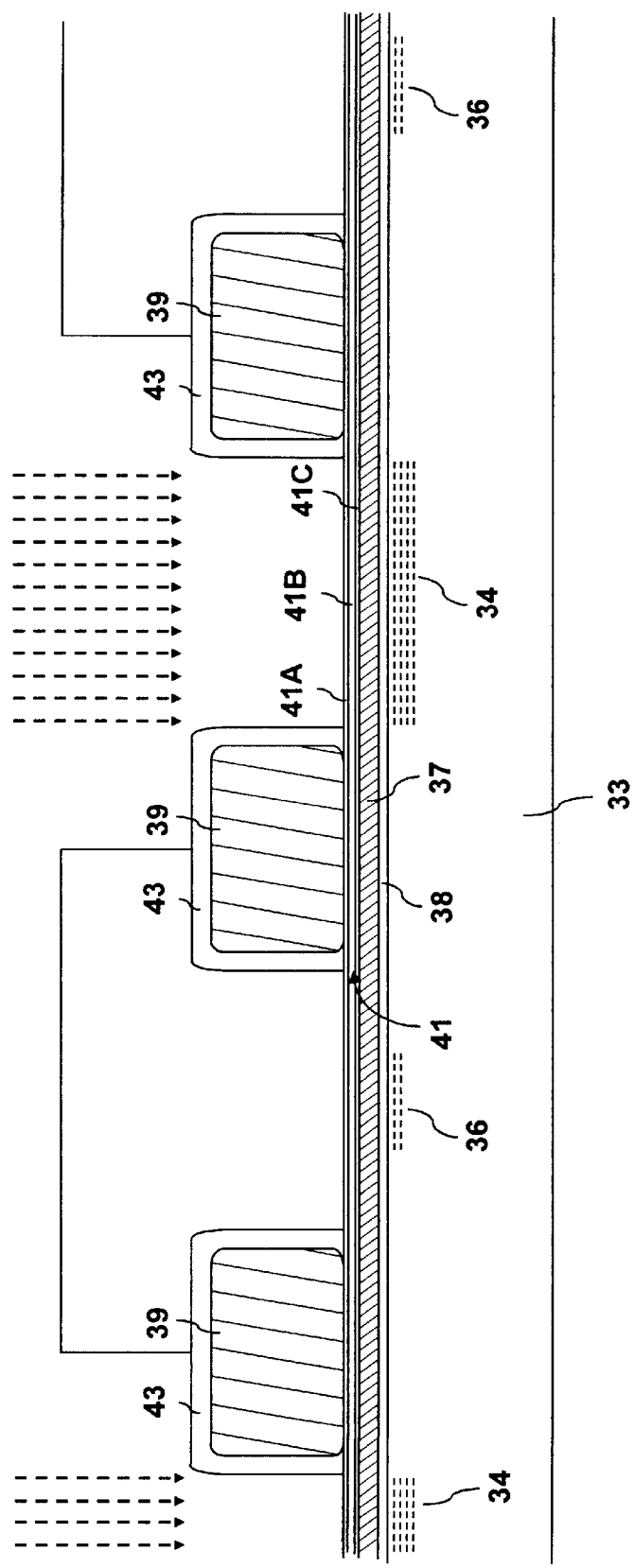

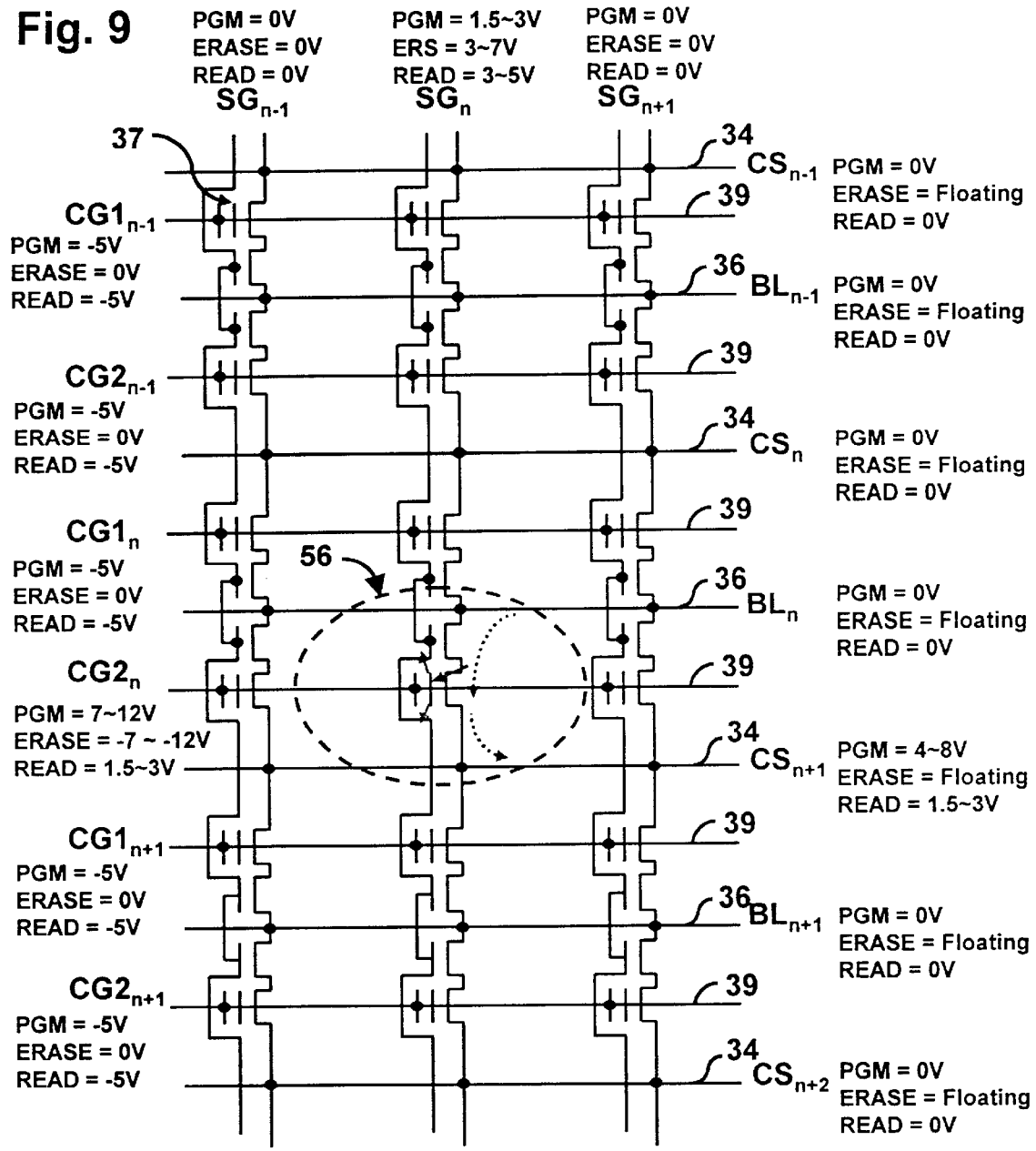

FLASH MEMORY CELL WITH CONTACTLESS BIT LINE, AND PROCESS OF FABRICATION

CROSS-REFERENCE TO RELATED APPLICATION

This is a division of Ser. No. 09/576,394, filed May 22, 2000.

BACKGROUND

1. Field of Invention

This invention pertains generally to semiconductor devices and, more particularly, to a flash memory cell with a contactless bit line.

2. Related Art

Electrically programmable read only memory (EPROM) has been widely used as nonvolatile memory which can keep data unchanged even though the power is turned off. However, EPROM devices have a major disadvantage in that they have to be exposed to Ultra-Violet (UV) light for about 20 minutes for data erasure. This is very inconvenient because an EPROM device has to be unplugged from its socket and moved to the UV light source when the data needs to be changed.

Electrically erasable programmable read only memory (EEPROM) overcomes this problem and permits data to be erased electrically in a much shorter period of time, typically less than 2 seconds. However, it still has a disadvantage in that the data must be erased on a byte-by-byte basis.

Flash EEPROM is similar to EEPROM in that data is erased electrically and relatively quickly. However, with flash EEPROM, the data is erased in blocks which typically range in size from 128 bytes to 64K bytes per block, rather than on a byte-by-byte basis.

In general, there are two basic types of nonvolatile memory cell structures: stack-gate and split-gate. The stack-gate memory cell usually has a floating gate and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 1.0–2.0 volts after an erase cycle, which adds complexity to the circuit design.

Although a split-gate memory cell has no over erase problem, it generally includes an additional gate known as a select gate. Such cells are typically fabricated in double-poly or triple-poly processes which involve relatively complex processing steps. In addition, split-gate cells are generally larger than stack-gate cells. Nevertheless, because of the relatively simple circuit design which is possible when there is no over-erase problem, split-gate cells are used widely, particularly in embedded nonvolatile memory applications.

Split-gate memory cells are commonly formed by first defining the floating gate pattern using a photolithographic mask and then defining the control gate (or select gate) pattern using another photolithographic mask. See, for example, U.S. Pat. Nos. 4,794,565, 5,029,130, and 5,455,792. This approach, however, has substantial limitations and disadvantages. During the photolithographic step in which the floating gate is defined, the corners of floating gate tend to become rounded. Also, pattern shifting can occur during the photolithographic steps, resulting in misalignment between the floating gate, the active area, and the control (or select) gate. Furthermore, in a typical cell array layout in which two adjacent memory cells share the same drain or source regions, the cumulative misalignment will make one cell worse than the other. In some cases, the effect of the misalignment may be so bad that in some of the memory cells in an array, the floating gate or the select gate may have a very short channel length and/or punchthrough may occur, with the result that the logic state of the memory cell may not be clearly identified. This makes the control of manufacturing process much more difficult and/or can force the cell array layout to be made much larger in order to provide more tolerance for the process variation. In U.S. Pat. No. 5,364,806, for example, the memory cell has two floating gate transistors which are separated by and share the same select gate which crosses over the stacked control gate and floating gate, the select gate channel area, and the bit-line diffusions.

A memory cell is erased by forcing electrons to migrate away from the floating gate so that it becomes charged with positive ions. This is commonly accomplished by Fowler-Nordheim tunneling in which a tunnel oxide having a thickness on the order of 70–120 Å is formed between the monocrystalline silicon substrate and the floating gate. A relative strong electric field (greater than 10 mV/cm) is then applied to the tunnel oxide, and the electrons tunnel from the floating gate toward the underlying source, drain or channel region. This technique is widely used both in stack-gate cells and in split-gate cells, and is described in greater detail in U.S. Pat. Nos. 5,402,371, 5,284,784, 5,455,792 and 5,364,806.

Another way of forming an erase path is to grow a dielectric film between two polysilicon (poly-Si) layers as a tunneling dielectric. U.S. Pat. No. 5,029,130 discloses the formation of a sharp edge on the floating gate to enhance the local electric field around it, with the erase path being formed between the sharp edge and the control gate. By adding a third polycrystalline silicon layer as an erase layer which crosses over, or overlies, the floating gate and the control gate, an erase path can be formed between the side wall of floating gate and the erase layer. This technique is disclosed in U.S. Pat. Nos. 5,847,996 and 5,643,812.

Fowler-Nordheim tunneling can also be used to program a memory cell by forcing electrons to tunnel into the floating gate so that it becomes charged negatively. U.S. Pat. No. 5,402,371, for example, shows electrons being forced to tunnel into the floating gate from the channel region beneath it. This technique is used widely in stack-gate cells as well as in split-gate cells.

Another way of programming a split-gate memory cell is by the use of channel hot carrier injection. During a program operation, the electrons flowing from the source to the drain are accelerated by a high electric field across the channel region, and some of them become heated near the drain junction. Also, the floating gate voltage is usually high during a program operation because of the coupling voltage that is supplied to it either from the control gate or from the source or drain region that is partially overlapped by the floating gate. Some of the hot electrons can get accelerated by the resulting vertical electric field so that they then exceed the energy barrier of the gate oxide and get injected into the floating gate. Examples of this technique are found in U.S. Pat. Nos. 4,794,565, 5,029,130, 5,455,792 and 5,364,806.

FIG. 1 illustrates a split-gate memory cell having a polysilicon select gate 12 positioned to one side of a floating gate 13 and a control gate 14. In the program mode, the control gate is biased at a high voltage (about 18 volts), and source 16, drain 17 and select gate 12 are biased at 0 volts. A strong electric field is thus established across gate oxide 18, where Fowler-Nordheim tunneling takes place, causing electrons to tunnel from the channel region into the floating gate.

In the erase mode, a positive voltage of about 9 volts is applied to the P-well 19, a negative voltage of about −9 volts is applied to the control gate, and the source, drain and select gate are kept open. In this mode, the high electric field across gate oxide 18 will initiate Fowler-Nordheim tunneling, and electrons will tunnel from the floating gate to the channel region beneath it.

FIG. 2 illustrates a split-gate memory cell having a floating gate 21, a control gate 22 and a select gate 23, with a portion of the select gate crossing over the control gate. In the program mode, the control gate is biased at a high voltage of about 12 volts, the select gate and the drain node 24 are biased at about 3 volts, and the source node 26 is grounded. With these bias voltages, most of the drain-to-source voltage falls in the mid-channel region 27, where a strong electric field is established. Being coupled to the control gate, the floating gate is at a voltage which is higher than the voltage in the mid-channel region, forming a vertical electric field. Electrons flowing from the source to the drain are accelerated by the high electric field in the mid-channel region and become heated, and some of them are injected into the floating gate due to acceleration by the vertical electric field.

In the erase mode, the control gate is biased at a negative voltage of about −12 volts, the drain node is biased at about 3 volts, and the select gate and the source node are grounded. A high voltage is now established across the tunnel oxide 28 between the floating gate and the drain region beneath the floating gate. This causes electrons to tunnel from the floating gate into the portion of the drain region beneath it.

OBJECTS AND SUMMARY OF THE INVENTION

It is in general an object of the invention to provide a new and improved memory cell array and process of fabrication.

Another object of the invention is to provide a memory cell array and process of the above character which overcome the limitations and disadvantages of the prior art.

These and other objects are achieved in accordance with the invention by providing a memory cell array and process of fabrication in which a floating gate is formed on a substrate for each of a plurality of memory cells, a control gate is formed above and in vertical alignment with each of the floating gates, source regions are formed in the substrate between and partially overlapped by first edge portions of the floating gates in adjacent ones of the cells, bit lines are formed in the substrate midway between second edge portions of the floating gates in adjacent ones of the cells, and a select gate is formed across the control gates, the floating gates, the bit lines and the source regions.

BRIEF DESCRIPTION OF THE DRAWINGS

FIGS. 5A–5F are enlarged, simplified cross-sectional views similar to FIG. 4, illustrating the steps in one embodiment of a process for fabricating the memory cell array of FIG. 3.

FIG. 9 is a circuit diagram of the memory cell array of FIGS. 3 and 8.

DETAILED DESCRIPTION

Figure 1:
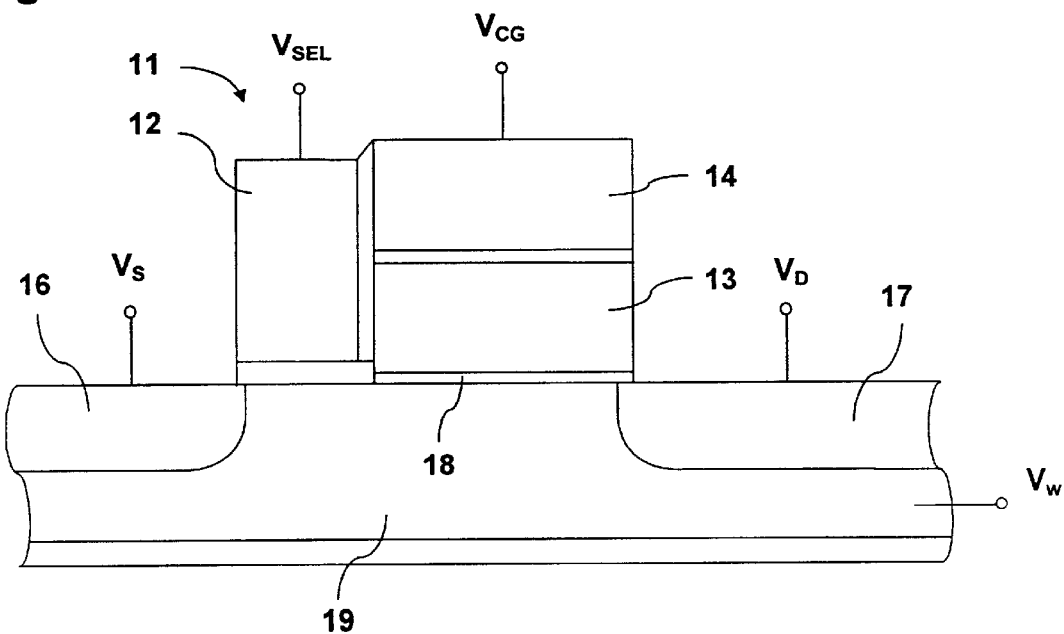
FIG. 1 is a cross-sectional view of a sidewall-type EEPROM memory cell of the prior art.
Figure 2:
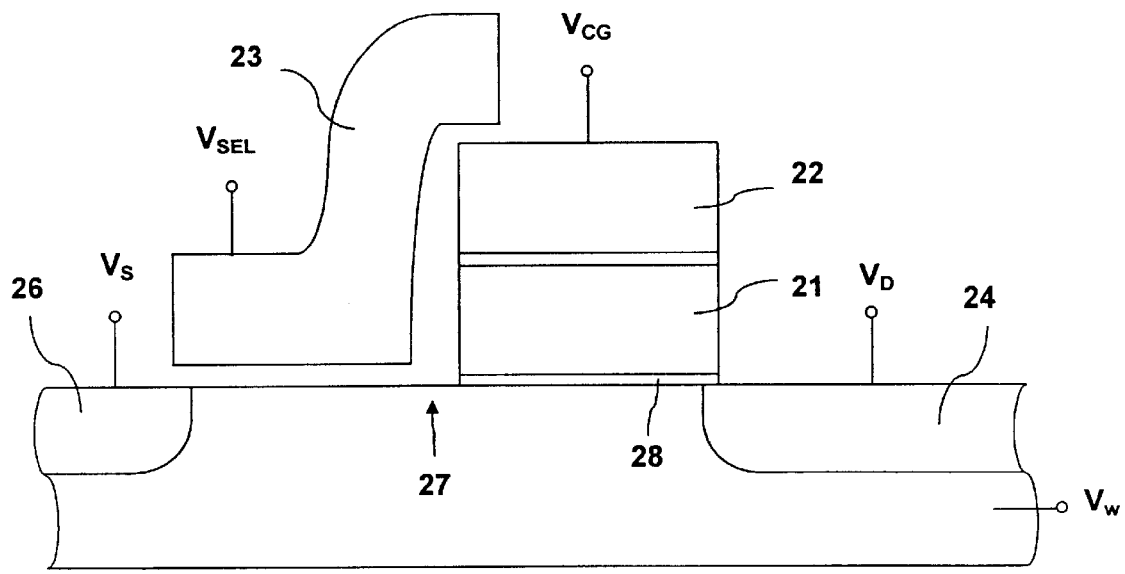
FIG. 2 is a cross-sectional view of a flash EEPROM memory cell of the prior art in which a portion of the select gate crosses over the control gate.
Figure 3:
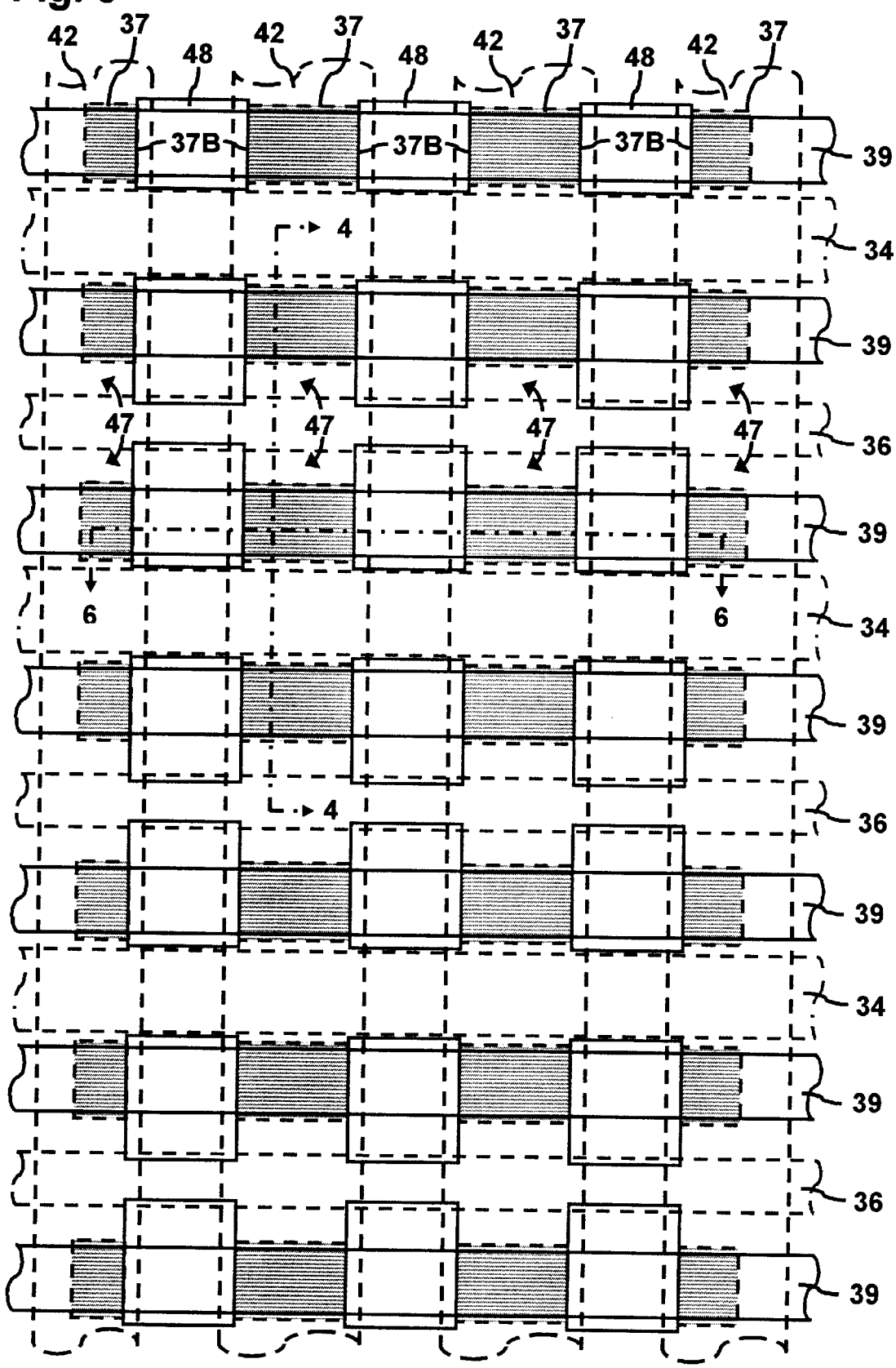
FIG. 3 is a top plan view of one embodiment of a flash memory cell array incorporating the invention, in which the floating gates are self-aligned with the edges of the active areas.
Figure 4:
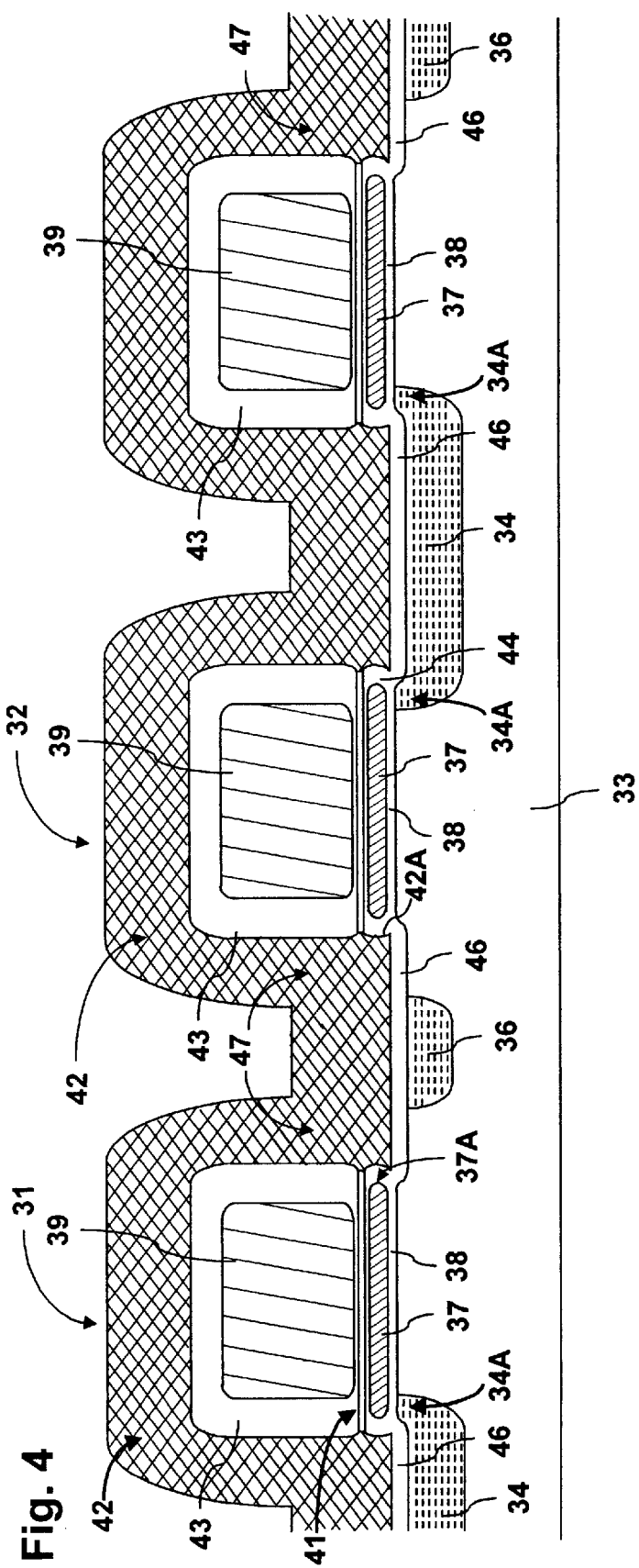
FIG. 4 is an enlarged, simplified cross-sectional views taken along line 4—4 of FIG. 3.

In the embodiment illustrated in FIGS. 3–4, the memory cells 31, 32 are formed on a silicon substrate 33 in which source regions 34 and bit lines 36 are formed. The memory cells have floating gates 37, with a thin oxide layer 38 between the floating gates and the substrate. Control gates 39 are stacked above and in vertical alignment with the floating gates, with an insulating film 41 between them. This film preferably comprises a top layer of oxide, a middle layer of nitride, and a bottom layer of oxide. The control gates are narrower than the floating gates, and the lateral edges of the floating gates extend beyond the lateral edges of the control gates.

Select gates 42 cross over the control gates and the floating gates, with a thick dielectric film 43 separating the select gates from the control gates and a thin tunnel oxide 44 separating the select gates from the floating gates. A thick dielectric film 46 is provided between the select gates and the substrate.

The lateral edges 37A of the floating gates are convexly or outwardly rounded, and the opposing portions of the side walls of the select gates are concavely or inwardly rounded, as indicated at 42A. The curvature is relatively sharp since the floating gates are relatively thin, and an erase path is formed through tunnel oxide 44 between the rounded edges 37A, 42A of the floating gates and the select gates.

In memory cells 31, 32, the two select gate transistors 47 share the same select gate 42 and the same bit line diffusion 36, and the source region 34 is overlapped partially by the floating gates of the two adjacent memory cells.

As illustrated in FIG. 3, the edges 37B of the floating gates are self-aligned with the edges of isolation regions 48 and, hence, with the edges of the active regions. As viewed in this figure, control gates 39 cross over the floating gates and isolation regions in the horizontal direction, and select gates 42 cross over the stacked control and floating gates, source diffusions 34, bit line diffusions 36, and the edges of isolation regions 48 in the vertical direction.

A presently preferred process for fabricating the memory cell array of FIGS. 3–4 is illustrated in FIGS. 5A–5F.

Silicon substrate 33 can be a P-well material, an N-well material or simply a P-type material. An oxide layer 38 having a thickness on the order of 70–250 Å is thermally grown on the silicon substrate to form the gate oxide, and a layer 37 of polysilicon or amorphous silicon (the poly-1 layer) is deposited on the oxide layer for use in the floating gates. The poly-1 layer has a thickness on the order of 100–1000 Å, and is preferably doped with phosphorus, arsenic or boron to a level on the order of $10^{17}$ to $10^{20}$ per $cm^3$.

Dielectric film 41 (the inter-poly dielectric) is then formed on the poly-1 layer. This film can be either a pure oxide film or a combination of oxide and nitride. In one presently preferred embodiment, it consists of a top oxide layer 41A having a thickness on the order of 30–100 Å, a central nitride layer 41B having a thickness on the order of 60–300 Å, and a bottom oxide layer 41C having a thickness on the order of 30–100 Å.

A second polysilicon layer 39 (the poly-2 layer) is deposited over dielectric film 41. This layer has a thickness on the order of 1500–3500 Å, and is doped with phosphorus, arsenic or boron to a level on the order of $10^{20}$ to $10^{21}$ per $cm^3$. A CVD oxide or nitride layer 51 having a thickness on the order of 300–1000 Å is deposited on the poly-2 layer.

Figure 5C:
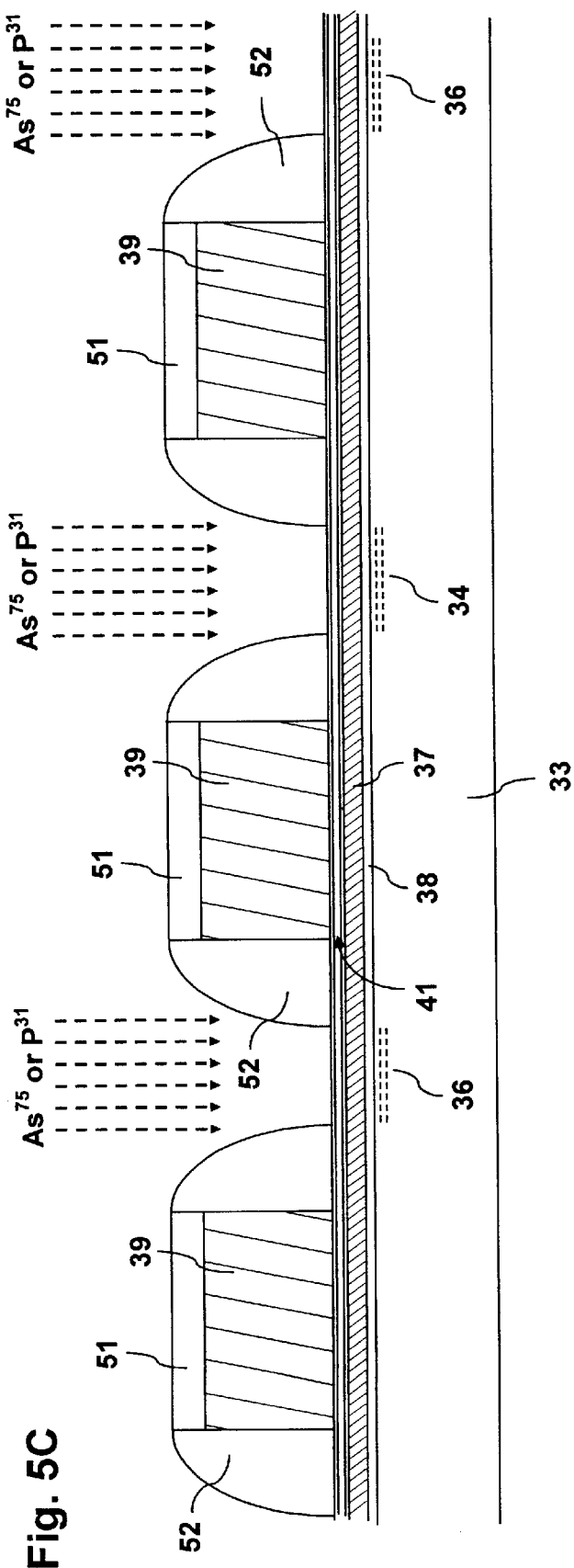

Using a photolithographic mask (not shown), oxide or nitride layer 51 and poly-2 layer 39 are etched anisotropically to form the control gates, as illustrated in FIG. 5B. Thereafter, a dielectric film such as oxide or nitride is deposited across the wafer to a thickness on the order of 1000–3000 Å. That film is then etched anisotropically to remove the dielectric material on the flat areas, leaving dielectric spacers 52 around the sides of the control gates, as illustrated in FIG. 5C.

Using the control gates and the dielectric spacers as a mask, an ion implantation is then performed to form diffusion regions 34, 36 in the substrate. These regions contain dopants of a type opposite the silicon substrate. Thus, for example, with a p-type substrate, the diffusion regions are doped with an n-type material such as arsenic or phosphorous.

After the dielectric spacers are then etched away, a dielectric film 43 is formed around the control gates, as illustrated in FIG. 5D. This film can be a pure thermal oxide or a combination of oxide and nitride. A photolithographic step is then performed to expose the source areas, and a further ion implantation is performed to complete source regions 34. Here again, the dopants are of a type opposite the substrate, e.g. arsenic or phosphorus dopants with a p-type silicon substrate.

Figure 5E:
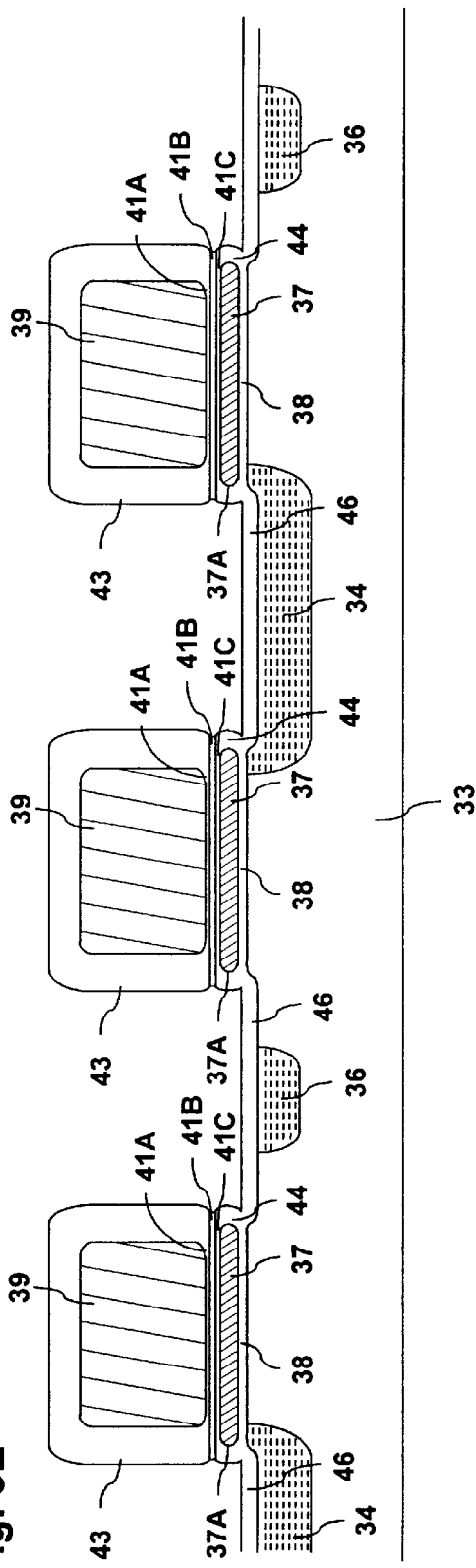
Figure 5F:
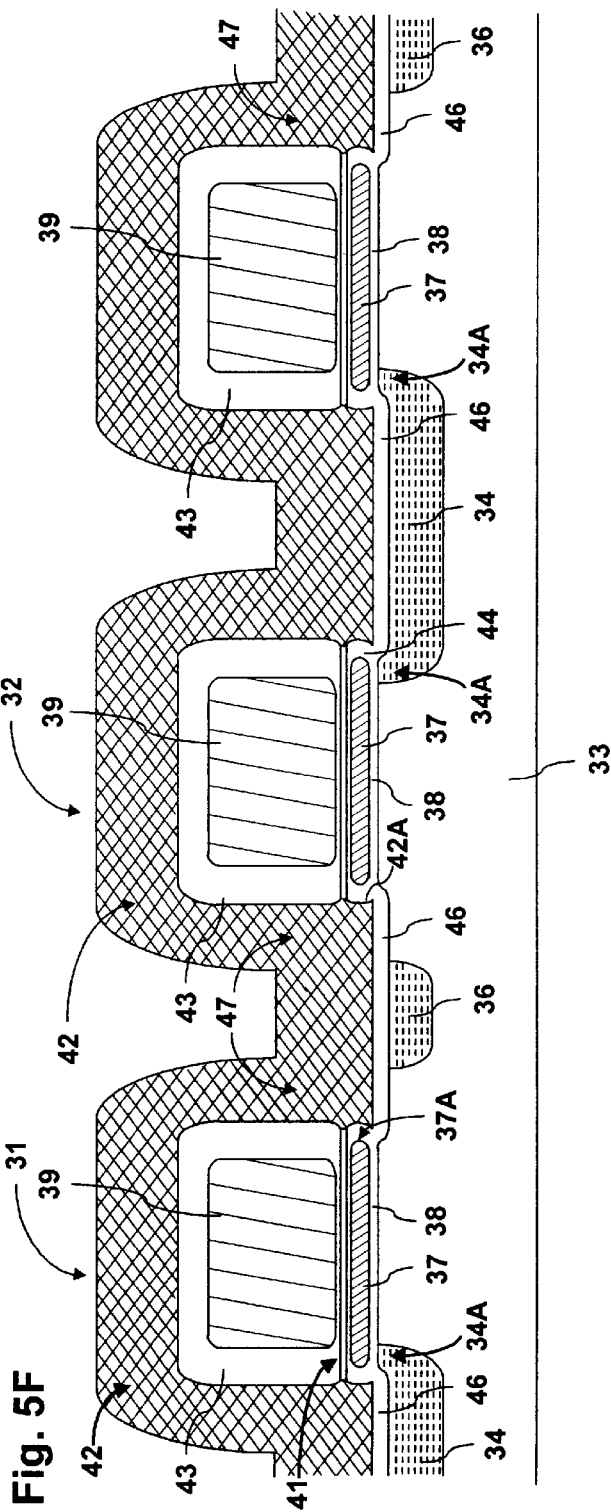

Using the dielectric material 43 on control gates 39 as a mask, the inter-poly dielectric 41 and the poly-1 layer 37 are etched away anisotropically, and a thermal oxidation is performed. As illustrated in FIG. 5E, that oxidation results in the formation of the gate oxide 46 for the select gates, and the poly-oxide 44 at the edges of the floating gates 37. At the same time, the oxide 43 surrounding the control gates increases in thickness. The thickness of gate oxide 46 is on the order of about 100–400 Å, and the thickness of poly-oxide 44 is preferably on the order of 100–300 Å. If desired, a thin CVD oxide having a thickness on the order of about 50–200 Å can be deposited after the thermal oxidation to improve the quality of the oxide films and to reduce disturbances between the select gates and the floating gates. During the thermal oxidation step, the lateral edges or side walls 37A of the floating gates become sharply rounded because the oxidation rate for the poly-1 layer is faster near the interfaces with oxide layers 38, 41 than it is toward the center of the poly-1 layer. This sharply rounded curvature provides an electric field enhancement which makes it much easier for electrons to tunnel out of the floating gate through this area to the concavely curved portion of the side walls of the select gates. The rounded corners also eliminate the localized trapping effect which occurs in a tunnel oxide near square corners of poly-1 when the cells operate in a erase mode and the electrons tunnel from the floating gate to the select gate. Thus, the cycling performance of the memory cell can be enhanced.

As a result of these steps, the control gates are self-aligned with the floating gates and are narrower than the floating gates, with the lateral edges 37A of the floating gates extending beyond the lateral edges of the control gates.

Following thermal oxidation, a third silicon layer 42 (the poly-3 layer) is formed across the whole wafer. This layer is typically formed of a doped polysilicon or polycide and has a thickness on the order of about 1500–4000 Å. A photolithographic mask is then formed over the poly-3 layer to define the select gate pattern, and the poly-3 is etched through the mask to form select gates 42. The rounded curvature at the edges 37A of the floating gates is reflected in the side walls 42A of the select gates because they are formed over the tunnel oxide 44 which follows the curvature of the edges.

Figure 6:
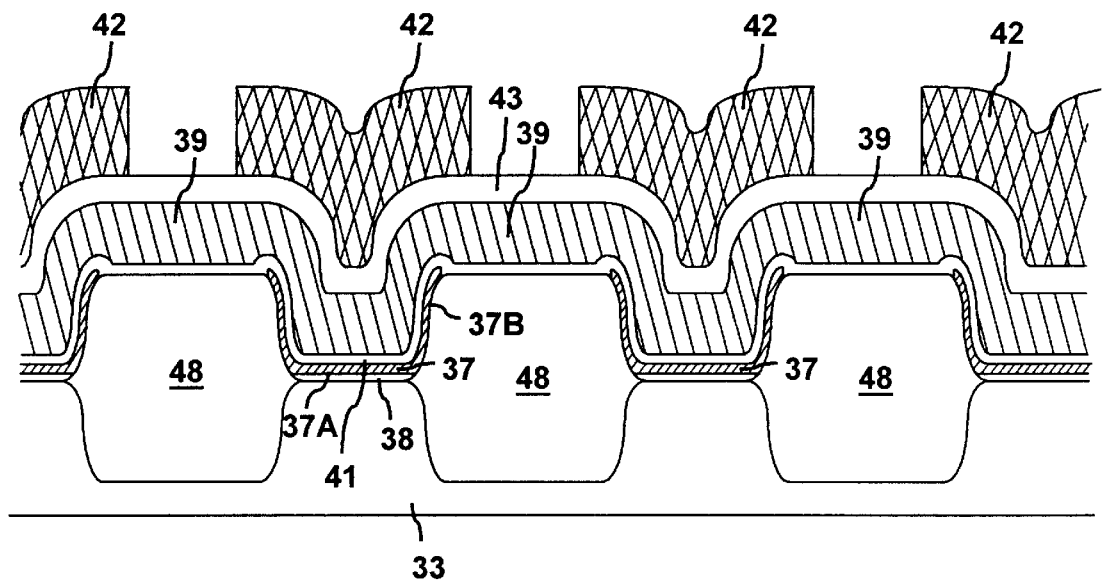
FIG. 6 is an enlarged cross-sectional view taken along line 6—6 of FIG. 3.
Figure 7:
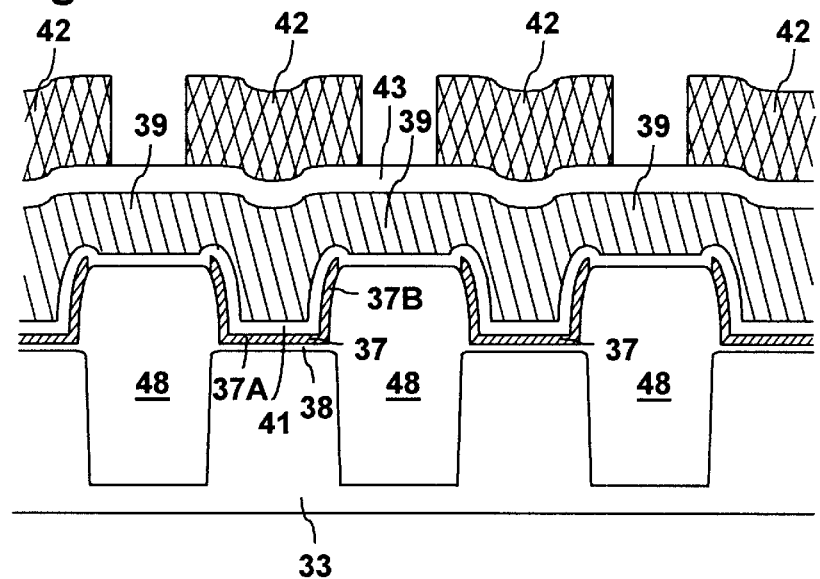
FIG. 7 is a view similar to FIG. 6 of an embodiment of a flash memory array according to the invention, with shallow trench isolation.

As best seen in FIG. 6, LOCOS (local oxidation of silicon) isolation is utilized in this embodiment, and the floating gates extend along the side walls of the isolation oxide 48 to provide a larger surface area for coupling with the control gates. The embodiment illustrated in FIG. 7 is similar except that it uses shallow trench isolation rather than LOCOS isolation.

Operation of the memory cells can now be described, with bias voltages being applied as set forth in the following table:

TABLE 1

| Operating Mode | Control Gate (Volts) | | Select Gate (Volts) | | Bit Line (Volts) | | Source (Volts) | |
|---|---|---|---|---|---|---|---|---|
| | Select | Unselect | Select | Unselect | Select | Unselect | Select | Unselect |
| Erase | −7 to −12 | 0 | 3 to 7 | 3 to 7 | Floating | Floating | Floating | Floating |
| Program | 7 to 12 | −5 to −7 | 1.5 to 3 | 1.5 to 3 | 0 | 0 | 4 to 8 | 0 |
| Read | 1 to 3 | −5 to −7 | 3 to 5 | 3 to 5 | 0 | 0 | 1.5 to 3 | 0 |

During an erase operation, electrons inside the floating gates are forced to tunnel into the select gates, and positive ions become the majority inside the floating gates. In general, when the electric field across the tunnel oxide is greater than about 10 MV/cm, Fowler-Nordheim tunneling becomes prominent, and the electrons with sufficient energy can tunnel from the cathode electrode to the anode electrode. However, with the curvature of the cathode electrodes sharply rounded, the voltage required for Fowler-Nordheim tunneling is reduced because the effective electric field is enhanced. This enhancement also makes it possible to use a thicker tunnel oxide and still maintain sufficient electron tunneling, if desired. In the erase mode, the selected memory cells are biased with about −7 to −12 volts on the control gates and 3 to 7 volts on the select gates, and the bit lines and source nodes are kept floating. This provides a coupling ratio on the order of 65 to 80 percent, which means that about 65 to 80 percent of the control gate voltage is coupled to the floating gates. As a result, most of the voltage difference between the select gates and the control gates falls across the tunnel oxide surrounding the rounded side walls of the floating gates, which triggers the Fowler-Nordheim tunneling of the electrons from the floating gates to the select gates.

When the floating gates contain more positive ions, the threshold voltage of the memory cell drops to the range of −5 to −1 volts. This results in an inversion layer in the channels under the floating gates when the control gates are biased at 1 to 3 volts. Therefore, the memory cells are in a conductive or "logic 1" state after an erase operation.

In the unselected memory cells, the control gates are biased at 0 volts, and the select gates are biased at about 3 to 7 volts. With those voltages, the electric field across the tunnel oxide is too small to produce Fowler-Nordheim tunneling.

During a program operation, electrons are injected by hot carrier injection into the floating gates from the mid-channel regions, and the floating gates become negatively charged. The selected memory cells are biased with about 7 to 12 volts on the control gates, about 1.5 to 3 volts on the select gates, 0 volts on the bit lines, and about 4 to 8 volts on the source nodes. These bias conditions make most of the source-to-drain voltage fall across the mid-channel regions between the select gates and the floating gates, resulting in a high electric field in the mid-channel regions. Moreover, the floating gates are coupled to high voltages by the voltages supplied to them by the source node and the control gate. Therefore, a high vertical electric field is established across the oxide between the mid-channel regions and the floating gates.

When electrons flow from the bit lines to the sources during a program operation, they are accelerated by the high electric field across the mid-channel region, and some of them become heated. The hot electrons are also accelerated by the vertical electric field, and some of them surpass the oxide barrier height of about 3.1 volts and inject into the floating gates. At the end of a program operation, the floating gate becomes negatively charged, and the threshold voltage of the memory cells increases to about 3 to 6 volts. Therefore, the memory cells are turned off or in a "logic 0" state when the control gates are biased at about 1 to 3 volts during a read operation.

With the unselected memory cells, the lit line and source nodes are biased at 0 volts, the control gates are biased at about −5 to −7 volts, and the select gates are biased at about 1.5 to 3 volts. This turns off the channels under the floating gates and eliminates the current flow between the bit lines and the sources of the unselected cells.

In the read mode, the selected memory cells are biased with about 1 to 3 volts on the control gates, about 1.5 to 3 volts on the sources, 0 volts on the bit lines, and about 3 to 5 volts on the select gates. When the memory cell is in the erased state, the read shows a conductive state because the floating gate channel and the select gate channel are both turned on. Thus, a "logic 1" state is detected by the sense amplifier circuit. When the memory cell is in the programmed state, the read shows a non-conductive state because the floating gate channel is turned off. Thus, a "logic 0" state is detected by the sense amplifier.

With the unselected memory cells, the bit lines and the source nodes are biased at 0 volts, the control gates are biased at about −5 to −7 volts, and the select gates are biased at about 3 to 5 volts. The bias on the control gate turns off the channels under the floating gates which eliminates the current flow between the bit lines and the sources of those cells.

Alternatively, instead of having the erase path between the rounded edges 37A of the floating gates and the side walls 42A of the select gates, gate oxide 38 can be used as the tunnel oxide, with the erase path between the edges of the floating gates and the underlying portions 34a of the source regions. In this embodiment, dielectric film 44 is made thicker, and the gate oxide is made thinner. In addition, the floating gates are preferably made thicker as well in order to reduce the sharpness of the rounded edge curvature and to increase the area of the rounded edges.

With the erase path between the floating gates and the source regions, bias voltages are applied as set forth in Table 2:

TABLE 2

| Operating Mode | Control Gate (Volts) | | Select Gate (Volts) | | Bit Line (Volts) | | Source (Volts) | |
|---|---|---|---|---|---|---|---|---|
| | Select | Unselect | Select | Unselect | Select | Unselect | Select | Unselect |
| Erase | −7 to −12 | 0 | Floating | Floating | Floating | Floating | 3 to 7 | 0 |
| Program | 7 to 12 | −5 to −7 | 1.5 to 3 | 1.5 to 3 | 0 | 0 | 4 to 8 | 0 |
| Read | 1 to 3 | −5 to −7 | 3 to 5 | 3 to 5 | 0 | 0 | 1.5 to 3 | 0 |

In the erase mode, Fowler-Nordheim tunneling causes electrons to travel from the floating gates to the portions of the source regions beneath the floating gates. In that mode, a biasing voltage on the order of about −7 to −12 volts is applied to the control gates, a positive voltage on the order of about 3 to 7 volts is applied to the source nodes, and the bit lines and select gates are kept floating. With these voltages, a strong electric field (i.e., greater than 10 MV/cm) is established across tunnel oxide 38. As in the previous embodiment, the coupling ratio between the control gates and the floating gates in the erase mode is on the order of about 65 to 85 percent. Consequently, most of the voltage applied between the control gates and the source nodes appears across the tunnel oxide. This leads to Fowler-Nordheim tunneling, with electrons tunneling from the floating gates to the overlapped portions of the source regions.

After an erase operation, the floating gate is positively charged, and the threshold voltage of the memory cell drops to about −1 to −5 volts. This forms an inversion layer in the channel regions under the floating gates when the control gates are biased at about 1 to 3 volts during a read operation.

Therefore, the memory cells are in a conductive or "logic 1" state after an erase operation.

In unselected memory cells, both the control gates and the source nodes are biased at 0 volts, and consequently there is no Fowler-Nordheim tunneling from the floating gates to the source regions.

Program operation is similar to that of the previous embodiment. After a program operation, the floating gate is negatively charged, and the threshold voltage of a memory cell is increased to about 3 to 6 volts. Therefore, the channel under the floating gate is turned off when the control gate is biased at about 1 to 3 volts during a read operation, and the cell is in a nonconductive ("logic 0") state after a program operation.

Figure 8:
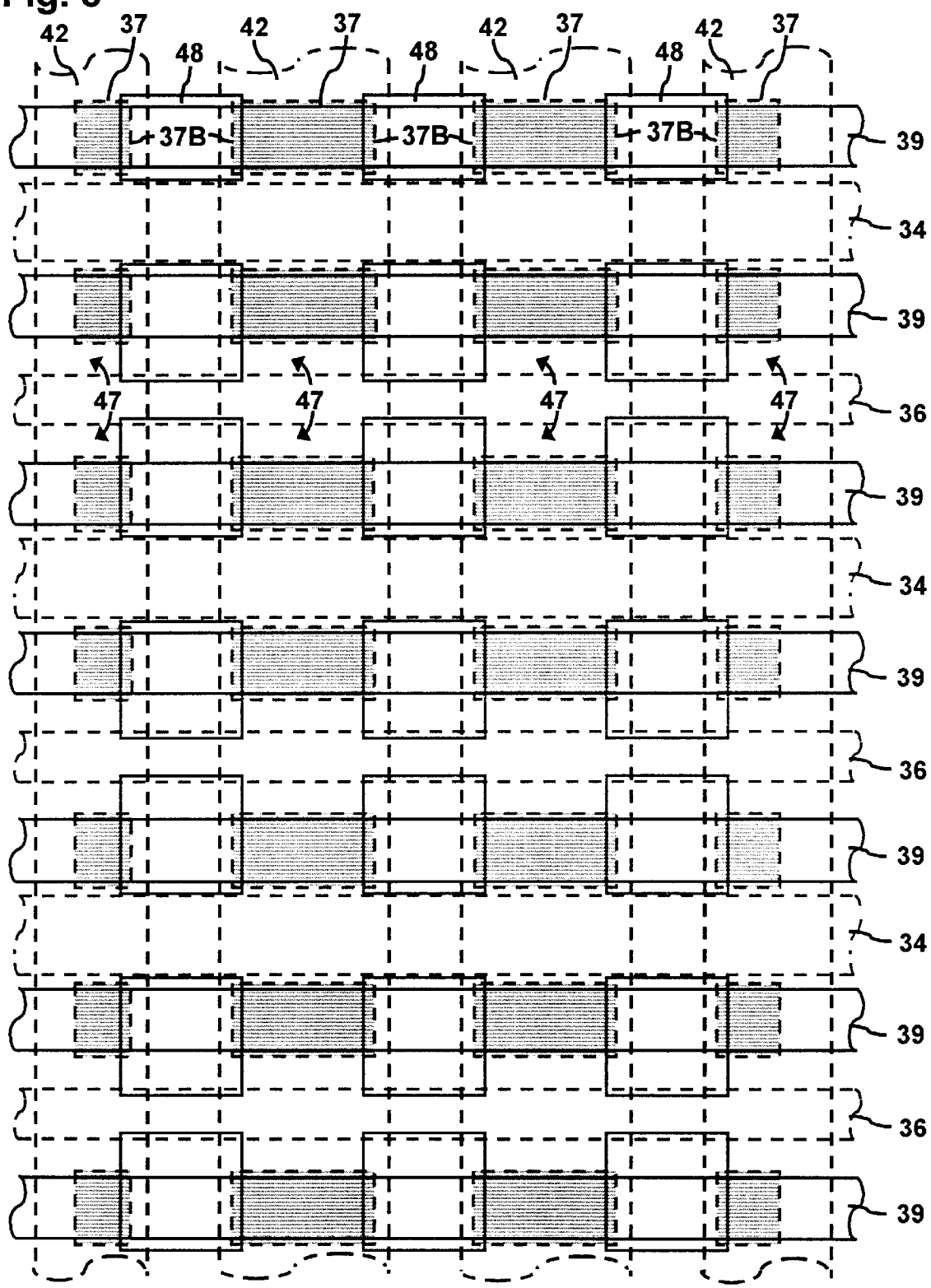
FIG. 8 is a top plan view of an embodiment of a flash memory cell array incorporating the invention, in which the floating gates are not self-aligned with the edges of the active areas.

The embodiment illustrated in FIG. 8 is similar to the embodiment of FIGS. 3–4 except that in this embodiment the floating gates 37 are not self-aligned with the edges of the active areas. Hence, rather than being aligned with the edges of isolation regions 48, the edges 37B of the floating gates cross over the isolation regions.

FIG. 9 is a circuit diagram for the cell array of either FIG. 3 or FIG. 8, with the bias voltages for program, erase and read operations shown next to each terminal of the array. In this example, the cell 56 at the intersection of $SG_n$ and $CG2_n$ is selected, and all other cells are unselected. During a program operation, the unselected cells have −5 volts on their control gates, which turns off the floating gate transistors and prevents current flow between the source and the bit line. Therefore, the unselected cells are not programmed.

During an erase operation, the unselected cells which share a control gate with the selected cell have about −7 to −12 volts on their control gates, while their select gates are grounded. With these voltages, there is no tunneling between the floating gates and the select gates.

During a read operation, the unselected cells which share a control gate with the selected cell have 0 volts on their bit lines and 0 volts on their select gates. This turns off the select transistors and prevents current flow between the bit lines and the sources. The other unselected cells have −5 volts on their control gates, which turns off the floating gate transistors and prevents current flow.

The invention has a number of important features and advantages. The floating gates, control gates, select gates, source regions and bit lines are all self-aligned. These memory cells can be made smaller in size because of the elimination of bit line contacts which are widely employed in memory cells of the prior art. The cells also have greater uniformity because of the self-alignment of the different elements.

The control gate which is above and in vertical alignment with the floating gate is used as for high voltage coupling to the floating gate. The floating gate is relatively thin and has edges which extend beyond the edges of the control gate and have a sharp rounded curvature to enhance erase paths between the floating gate and the select gate and between the floating gate and the underlying source region.

The bit line diffusions are positioned directly under the centers of the select gates and are self-aligned with the two adjacent floating gates. The select gates cross over the control gates, the floating gates, the bit line diffusions and the source regions, with two select gate transistors sharing the same bit line and select gate.

A program path is formed to carry electrons from the mid-channel regions between the select gates and the floating gates through the gate oxide to the protruding edges of the floating gates.

It is apparent from the foregoing that a new and improved memory cell and process of fabrication have been provided. While only certain presently preferred embodiments have been described in detail, as will be apparent to those familiar with the art, certain changes and modifications can be made without departing from the scope of the invention as defined by the following claims.

What is claimed is:

1. In a process of fabricating a memory cell array, the steps of: forming a floating gate on a substrate for each of a plurality of memory cells positioned side-by-side on the substrate, forming a control gate in overlying relationship with each of the floating gates, forming source regions in the substrate between and partially overlapped by first edge portions of the floating gates in adjacent ones of the cells, forming bit lines in the substrate midway between second edge portions of the floating gates in adjacent ones of the cells, and forming a select gate which crosses over the control gates, the floating gates, the bit lines and the source regions.

2. The process of claim 1 wherein electron tunneling paths are formed between the first edge portions of the floating gates and portions of the source regions which are overlapped by the first edge portions.

3. The process of claim 1 wherein the bit lines are positioned midway between the second edge portions of the floating gates.

4. The process of claim 1 wherein the bit lines are positioned beneath the select gate, and two select gates transistors are formed using one of the bit lines and the select gate.

5. The process of claim 1 including the step of applying a negative voltage to the control gates of unselected memory cells to turn off the floating gate transistors in those cells during program and read operations.

6. In a process of fabricating a memory cell array, the steps of: forming a floating gate on a substrate for each of a plurality of memory cells positioned side-by-side on the substrate, forming a control gate in overlying relationship with each of the floating gates being formed to be wider than the control gates and to have first and second edge portions which project laterally beyond the edges of the control gates, forming source regions in the substrate between and partially overlapped by first edge portions of the floating gates in adjacent ones of the cells, forming bit lines in the substrate midway between second edge portions of the floating gates in adjacent ones of the cells, and forming a select gate which crosses over the control gates, the floating gates, the bit lines and the source regions.

7. The process of claim 6 wherein the laterally projecting edge portions of the floating gates are formed to be sharply rounded.

8. The process of claim 7 wherein the select gates are formed with side walls which face the sharply rounded lateral edges of the floating gates, and electron tunneling paths are formed between the sharply rounded lateral edge portions of the floating gates and the side walls of the select gates.

9. In a process of fabricating a memory cell array, the steps of: forming a floating gate on a substrate for each of a plurality of memory cells positioned side-by-side on the substrate, forming a control gate in overlying relationship with each of the floating gates, forming source regions in the substrate between and partially overlapped by first edge portions of the floating gates in adjacent ones of the cells, forming bit lines in the substrate midway between second edge portions of the floating gates in adjacent ones of the cells, forming a select gate which crosses over the control gates, the floating gates, the bit lines and the source regions, and forming a hot carrier path for the injection of electrons during a program operation from a mid-channel region in the substrate between the select gate and the floating gate, to the floating gate, with high voltage coupling between the control gate and the floating gate.

10. In a process of fabricating a memory cell, the steps of: forming a first layer of oxide on a substrate, forming a poly-1 layer on the first oxide layer, forming a dielectric film over the poly-1 layer, forming a poly-2 layer over the dielectric film, forming a dielectric film over the poly-2 layer, etching away portions of the poly-2 layer and the dielectric film to form control gates, forming oxide spacers around the control gates, forming source and bit line diffusion regions in the substrate using the dielectric spacers as a mask, removing the dielectric spacers, forming a dielectric layer around the control gates, enlarging the source diffusion regions using the dielectric layer around the control gates as a mask, etching the poly-1 layer using the dielectric layer around the control gates as a mask to form floating gates which are wider than the control gate and have edge portions which project laterally from the edges of the control gates, building up oxide on the side walls of the floating gates, around the control gates and on the substrate above the source and bit line diffusion regions, depositing a poly-3 layer over the built-up oxide, and etching away portions the poly-3 layer to form select gates which overlie the floating and control gates, the bit line diffusion regions and the source diffusion regions.

11. The process of claim 10 wherein oxide is built up by thermal oxidation which produces a sharply curved rounding of the laterally projecting edges of the floating gates.

12. In a process of fabricating an array of memory cells positioned side-by-side on a substrate, the steps of: forming a floating gate and a control gate for each of the memory cells, with the control gate overlying the floating gate and the floating gates being wider and substantially thinner than the control gates and having first and second sharply rounded edge portions which project laterally beyond the edges of the control gates, forming source regions in the substrate between and partially overlapped by the first edge portions of the floating gates in adjacent ones of the cells, forming bit lines in the substrate between the second edge portions of the floating gates in adjacent ones of the cells, and forming a select gate which crosses over the control gates, the floating gates, the bit lines and the source regions.

13. The process of claim 12 wherein the floating gate is formed with a thickness on the order of 100–1000 Å, and the control gate is formed with a thickness on the order of 1500–3500 Å.

14. The process of claim 12 wherein the bit lines are positioned midway between the second edge portions of the floating gates.

15. In a process of fabricating a memory cell array having a plurality of memory cells positioned side-by-side on a substrate, the steps of: forming a floating gate and a control gate for each of the memory cells, with the control gate overlying the floating gate, forming source regions in the substrate between and partially overlapped by the first edge portions of the floating gates in adjacent ones of the cells, forming bit lines in the substrate midway between the second edge portions of the floating gates in adjacent ones of the cells, forming a select gate which crosses over the control gates, the floating gates, the bit lines and the source regions, and providing dielectric material between the floating gate and the control gate and between the control gate and the select gate, with the dielectric material between the floating gate and the control gate being substantially thinner than the dielectric material between the control gate and the select gate.

16. The process of claim 15 wherein the dielectric material between the floating gate and the control gate is formed to have a thickness on the order of 120 Å–500 Å, and the dielectric material between the control gate and the select gate is formed to have a thickness on the order of 1000 Å–3000 Å.

17. The process of claim 15 wherein the bit lines are positioned midway between the second edge portions of the floating gates.

* * * * *